United States Patent [19]

Buhler et al.

[11] Patent Number: 5,701,060

[45] Date of Patent: Dec. 23, 1997

[54] ON-CHIP HIGH FREQUENCY DAMPING FOR LASER DIODE DRIVER CHIPS

[75] Inventors: Steven A. Buhler, Sunnyvale; Hamid T. Bahramian, Torrence, both of Calif.

[73] Assignee: Xerox Corporation, Stamford, Conn.

[21] Appl. No.: 642,815

[22] Filed: May 3, 1996

[51] Int. Cl.[6] ............................................. H05B 43/00
[52] U.S. Cl. ........................ 315/227 R; 327/325; 327/583
[58] Field of Search ............................ 315/245, 227 R, 315/207, 151, 76, 244; 327/320, 325, 493, 502, 503, 504, 583, 584, 586; 250/552

[56] References Cited

U.S. PATENT DOCUMENTS 3,887,836  6/1975  Leete ................................. 315/207

*Primary Examiner*—Robert Pascal
*Assistant Examiner*—David Vu
*Attorney, Agent, or Firm*—Fariba Rad

[57] ABSTRACT

A laser diode driver chip is disclosed which has a circuit to substantially reduce a ringing on a laser diode driving current generated by the laser diode driver chip. This invention identifies that the ringing on the laser diode driving current is caused by three different resonances which are coupled together. This invention also suggests a model for the sources of these three different resonances and identifies the three main nodes which are common between the sources of resonances. Finally, this invention places a damping circuit between the three main nodes of the laser diode driver to substantially reduce the ringing on the laser diode driving current.

4 Claims, 6 Drawing Sheets

ON-CHIP HIGH FREQUENCY DAMPING FOR LASER DIODE DRIVER CHIPS

BACKGROUND OF THE INVENTION

This invention relates to an on-chip damping circuit and more particularly to a damping circuit used on a laser diode driver chip in order to resolve a problem known as ringing of a visible laser diode driving current.

The preferred embodiment of this invention is designed for a laser diode driver chip which provides a driving current to a visible laser diode. However, the disclosed embodiment of this invention can be utilized for laser diode drivers which provide current to other types of laser diodes. For the purpose of simplicity hereinafter, the "visible laser diode" will be referred to as "laser diode".

Referring to FIG. 1, there is shown a block diagram 5 of an application of a laser diode driver. Typically a laser diode 10 is connected to a power supply 12 through a laser diode driver chip 14. The power supply is connected to the laser diode driver chip 14 through a lead line 13 and the laser diode driver chip 14 is connected to the laser diode 10 through a lead line 15. The ground of the laser diode 10 is connected to the ground of the laser diode driver chip 14 and to the ground of the power supply 12 as shown by a lead line 17.

The reason the laser diode 10 is powered through a laser diode driver chip 14 is that the laser diode driver chip 14 is a controller chip. The laser diode driver chip 14 drives the laser diode 10 to an emitting state and to a non-emitting state by supplying a two level laser driving current to the laser diode. For the purpose of simplicity, hereinafter the "laser diode driver chip" will be referred to as "driver chip".

Referring to FIG. 2, there is shown a two level laser driving current 16 at its ideal format. Referring to both FIGS. 1 and 2, the driver chip 14 generates a two level current 16 based on a controlling signal such as a train of pixel information. The laser diode 10 is driven to a non-emitting state if it receives the level 18 of the current 16 and it starts emitting if it receives the level 20 of the current 16.

Typically, when the driver chip 14 switches the current from level 18 to level 20, the current 16 starts ringing. Referring to FIG. 3, there is shown the two level current 16 of FIG. 2 in a real situation. FIG. 3, shows a ringing 22 on current 16 when the current is switched from level 18 to level 20. The ringing of the current 16 is based on an oscillation caused by an unknown factor in the block diagram 5 of FIG. 1.

Referring to both FIGS. 1 and 3, the ringing 22 of the current 16 reduces the life time of the laser diode 10 and if the laser diode is used in a printing system, the ringing of the current 22 also reduces the print quality. Therefore, it is desirable to damp the ringing of the current 16 in order to prolong the life time of the laser diode 10 and improve the print quality. However, since it is not known what exactly causes the oscillation in the block diagram 5, it is difficult to damp the ringing 22 of the current 16.

It is an object of this invention to damp the ringing 22 in the laser driving current 16 to less than 20% of the maximum M of its first peak while keeping the rise time of the current 16 within 2 Ns. Considering level 18 (non-emitting state) of current 16 as 0% and level 20 (emitting state) of current 16 as 100%, the rise time of the current 16 as shown in FIG. 3 is defined by the time between the 10% and 90% of current 16.

SUMMARY OF THE INVENTION

In accordance with the present invention, there is disclosed a model to identify the source of a ringing problem on a laser diode driving current generated by a laser diode driver chip and there is disclosed a solution to the ringing problem. This invention recognizes that the ringing is caused by three different resonances which are coupled, provides a model which represents the three different sources of the resonances and identifies the common nodes between the sources of the resonances. The common nodes between the sources are $V_{DD}$ (the voltage receiving node of the chip), the output node and the chip ground. By placing individual RC (a resistor and a capacitor in series) circuits across these three nodes, each resonance is individually damped. As a result, the ringing problem on the laser diode driving current is also damped.

DETAILED DESCRIPTION OF THE INVENTION

Figure 1:
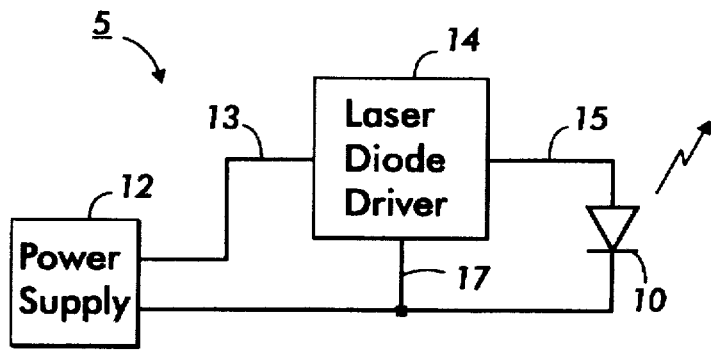
FIG. 1 shows a prior art block diagram of an application of a laser diode driver.
Figure 2:
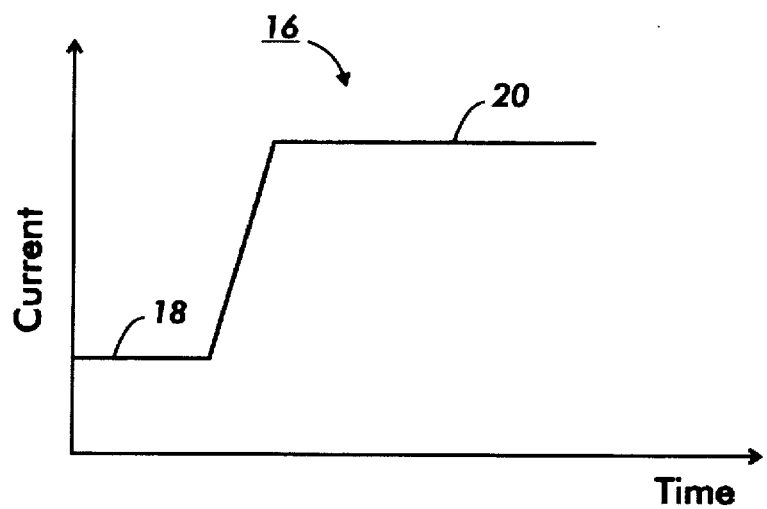
FIG. 2 shows a prior art two level laser driving current at its ideal format.

To reduce the ringing in a laser diode driving current, since the source of oscillation was not known, different models of the block diagram 5 of FIG. 1 had to be created in order to duplicate the problem and find the source or sources of the oscillation. In the first approach, it was assumed that the portion in which the oscillation is generated is a loop which consists of the output of the driver chip 14 of FIG. 1 and the laser diode 10 of FIG. 1.

Figure 4:
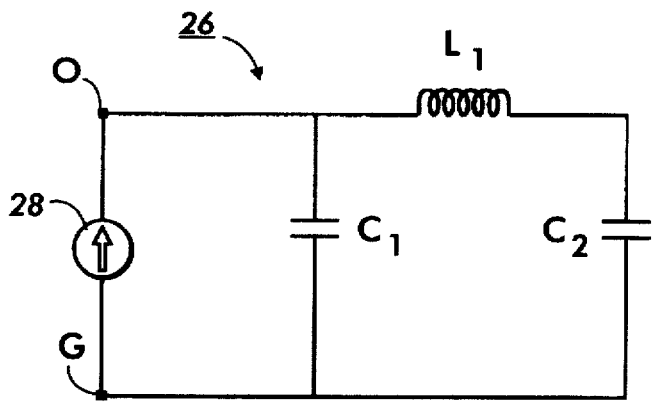
FIG. 4 shows a model for the block diagram of FIG. 1.

Referring to FIG. 4, there is shown a model 26 of the portion of the block diagram 5 of FIG. 1 which causes the oscillation. In FIG. 4, the suggested model for the output of the driver chip 14 of FIG. 1 is a current source 28 and a capacitance $C_1$ which are considered to be located between the output node O of the driver chip and the chip ground G of the output driver chip. The output node O is a node which is in control of the laser diode driving current and the chip ground G is an internal ground to the packaged laser diode driver chip 14. Also, the suggested model for the laser diode 10 of FIG. 1 is a capacitance $C_2$ and the suggested model for the lead connection 15 between the driver chip 14 and the laser diode 10 of FIG. 1 is an inductance $L_1$. Inductance $L_1$ includes the inductance of the bond wires of the driver chip 14 and the laser diode 10 in addition to the inductance of the lead connection between the driver chip 14 and the laser diode 10.

By studying this model 26, it is determined that since the capacitance $C_2$ representing the laser diode 10 is a large capacitance, when the laser diode is in the emitting state (forward bias), the capacitance $C_2$ will act as a short. As a result, the oscillation should be caused by the capacitance $C_1$ and the inductance $L_1$.

Figure 5:
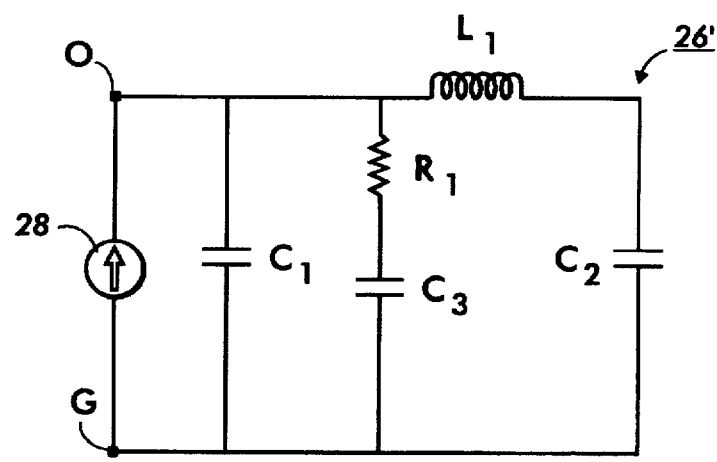
FIG. 5 shows a damping circuit consisting of an RC circuit being placed in parallel with the capacitance $C_1$ of FIG. 4.

Referring to FIG. 5, there is shown model 26' which is the same as model 26 with the addition of the damping circuit. In FIG. 5, to damp the oscillation caused by the capacitance $C_1$ and the inductance $L_1$ an RC (a resistor and a capacitor in series) circuit consisting of resistor $R_1$ and capacitor $C_3$ is placed in parallel with the capacitance $C_1$ on the driver chip 14 of FIG. 1.

In FIG. 5, the added RC circuit causes both series resonance and parallel resonance. In parallel resonance, the original capacitance $C_1$ and the inductance $L_1$ which cause the resonance are in parallel with resistor $R_1$. In series resonance, the added capacitor $C_3$ and the inductance $L_1$ which cause the resonance are in series with resistor $R_1$.

It should be noted that in this specification, the terms "capacitance" and "inductance" represent modeled elements. However, the terms "capacitor" and "resistor" represent actual elements of the damping circuit.

In order to damp a series resonance, a resistor with a higher resistance should be selected. However, for damping a parallel resonance, a resistor with a very low resistance is required. Therefore, since in FIG. 5 both series resonance and parallel resonance exists, resistor $R_1$ has to be selected in such a manner to have a resistance which is not too high and not too low in order to damp both kinds of resonances. The value of the resistor $R_1$ is also dependent on the value of the inductance $L_1$ and the capacitor $C_1$.

Figure 6:
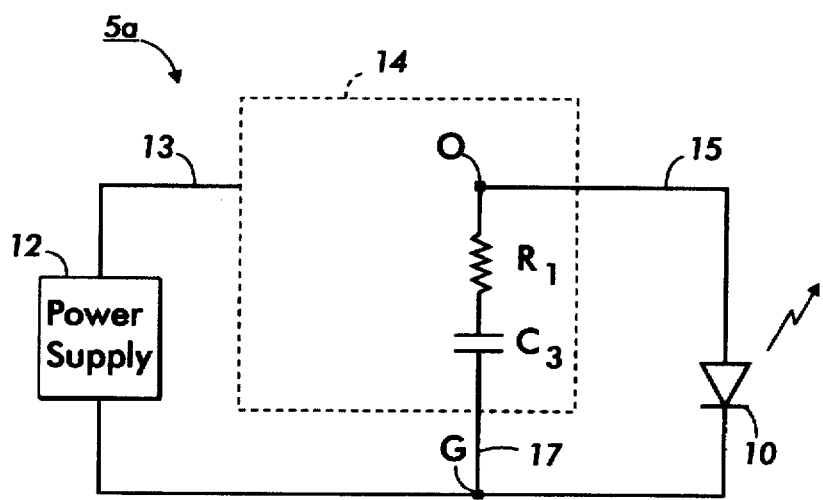
FIG. 6 shows the damping circuit of FIG. 5 being added to the block diagram of FIG. 1.

Once the values of the resistor $R_1$ and the capacitor $C_3$ were defined, they had to be placed on the driver chip 14 of FIG. 1 to determine if they would damp the ringing on the laser diode driving current. Referring to FIG. 6, there is shown $R_1$ and $C_3$ being added to the driver chip 14 of FIG. 1. $R_1$ and $C_3$ were placed on the chip between the output node O and the chip ground G. The reason $R_1$ and $C_3$ were placed on the chip was to prevent adding extra lead inductances which would be added if they were placed outside of the chip.

Once the resistor $R_1$ and the capacitor $C_3$ were placed on the chip, the ringing on the laser diode driving current was reduced but not sufficiently. Therefore, a different model than the model 26 of FIG. 4 had to be used in order to design a more effective damping circuit.

Figure 7:
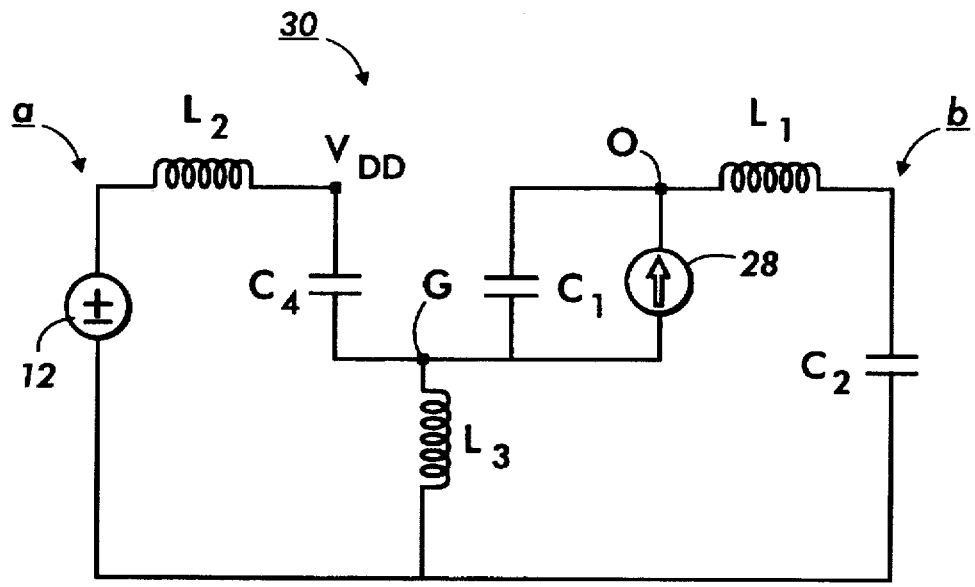
FIG. 7 shows a different model for the block diagram of FIG. 1.

Referring to FIG. 7, there is shown a suggested model 30 of this invention. In FIG. 7, the power supply 12 of FIG. 1 is shown by the symbol 12 of a power supply. The power supply 12 of FIG. 1 has a decoupling capacitor which is typically mounted next to the packaged driver chip 14 of FIG. 1. The decoupling capacitance of the power supply 12 is a large capacitance and does not contribute to the oscillation. Therefore for the purpose of simplicity, in the model of FIG. 7 and the models of the following Figures, the decoupling capacitance of the power supply 12 of FIG. 1 is not shown. Again referring to FIG. 7, the laser diode 10 of FIG. 1 is modeled as capacitance $C_2$. In this approach, the driver chip 14 of FIG. 1 is modeled as a capacitance $C_1$, current source 28 and capacitance $C_4$. Capacitance $C_1$ and the current source 28 are considered to be located between the output node O and the chip ground G and capacitor $C_4$ is considered to be located between $V_{DD}$ and the chip ground G. $V_{DD}$ is the voltage receiving node of the chip and it has a voltage substantially the same as the voltage of the power supply 12.

Referring to both FIGS. 1 and 7, it is suggested that the lead line 15 shared by the driver chip 14 and the laser diode 10 has an inductance shown by $L_1$. Also, it is suggested that the lead line 13 shared by the power supply 12 and the driver chip 14 has an inductance shown by $L_2$. In addition, it is suggested that the lead line 36 which is the ground line of the driver chip has an inductance shown by $L_3$.

Inductance $L_3$ couples the resonances of loop a and loop b. Loop a consists of inductance $L_2$, capacitance $C_4$, inductance $L_3$ and the power supply 12. Loop b consists of inductance $L_1$, capacitance $C_2$, inductance $L_3$ and capacitance $C_1$. As a result, when any one of the inductances $L_1$ and $L_2$ is stimulated by the change of the level on the laser driving current 16 (FIG. 3), both inductances $L_1$ and $L_2$ and their respective capacitance $C_1$ and $C_4$ start resonating. However, the resonance of each inductance is at a different frequency and they are coupled with each other. Therefore, every time the driver chip 14 is switched, both inductances $L_1$ and $L_2$ with their respective capacitances $C_1$ and $C_4$ resonate.

In order to damp each resonance separately, it is needed to change and separate the two frequencies of the resonances from each other as much as possible. Therefore, it is needed to add an additional capacitor to the driver chip in order to change the frequency of the resonance generated by the inductance $L_1$ and $C_4$. It should be noted that changing one of the frequencies does not change the coupling between the two resonances.

Figure 8:
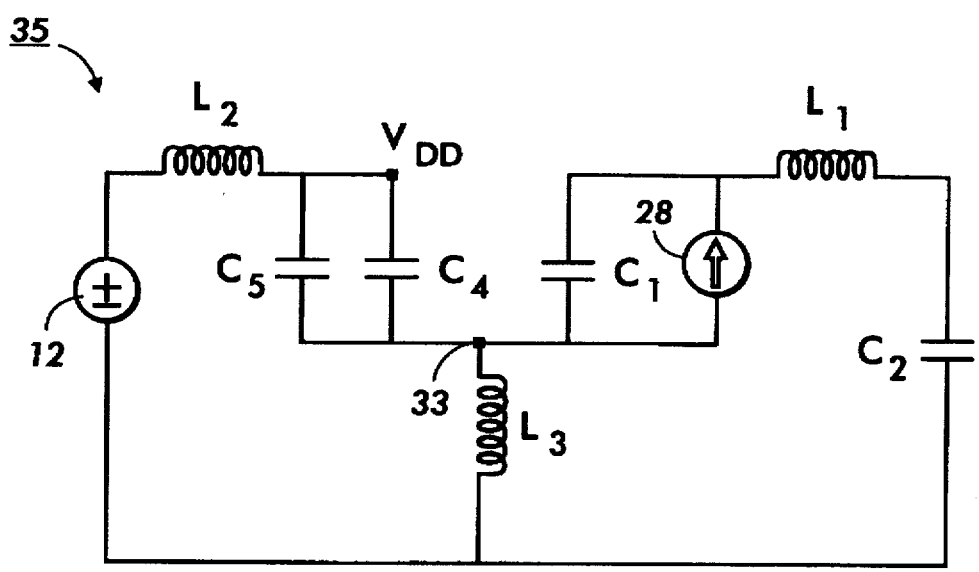
FIG. 8 shows the model of FIG. 7 with an additional capacitor $C_5$ which modifies the frequency of one of the resonance of the model of FIG. 7.

Referring to FIG. 8, there is shown the additional capacitor $C_5$ which causes the frequency of resonance generated by the inductance $L_1$ and $C_4$ to substantially differ from the frequency of resonance generated by the inductance $L_1$ and the capacitance $C_1$.

Figure 9:
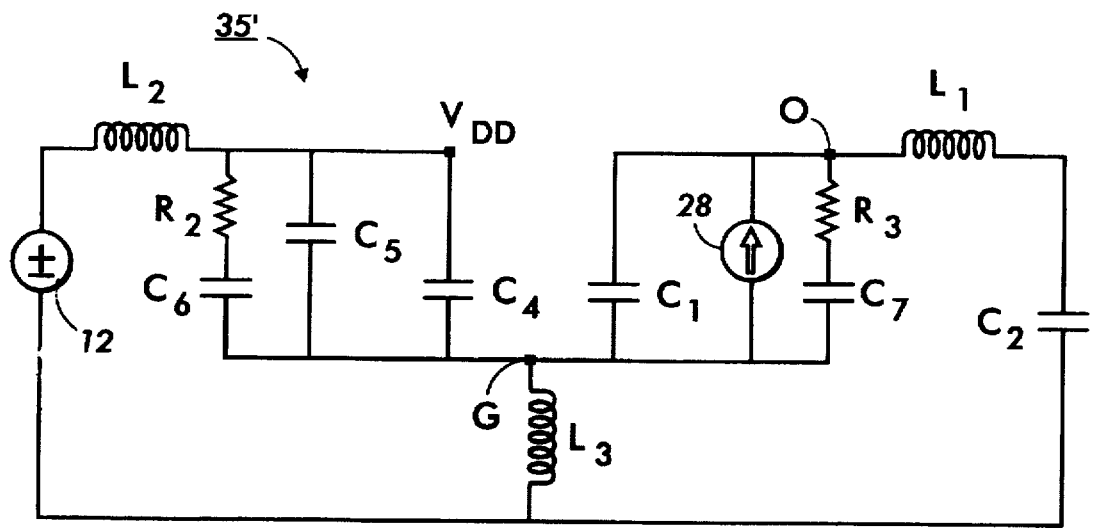
FIG. 9 shows the model of FIG. 8 with the addition of a damping circuit.

Referring to FIG. 9, there is shown model 35' which is the same as model 35 with the addition of the damping circuit. In FIG. 9, in order to damp each resonance separately, an RC circuit is suggested for each resonance. Resistor $R_2$ and capacitor $C_6$ are connected in parallel to capacitance $C_4$ and capacitor $C_5$ to damp the resonance generated by the inductance $L_2$ and the combination of the capacitance $C_4$ and capacitor $C_5$. Also, resistor $R_3$ and the capacitor $C_7$ are connected in parallel to the current source 28 to damp the resonance generated by the inductance $L_1$ and the capacitance $C_1$.

Figure 10:
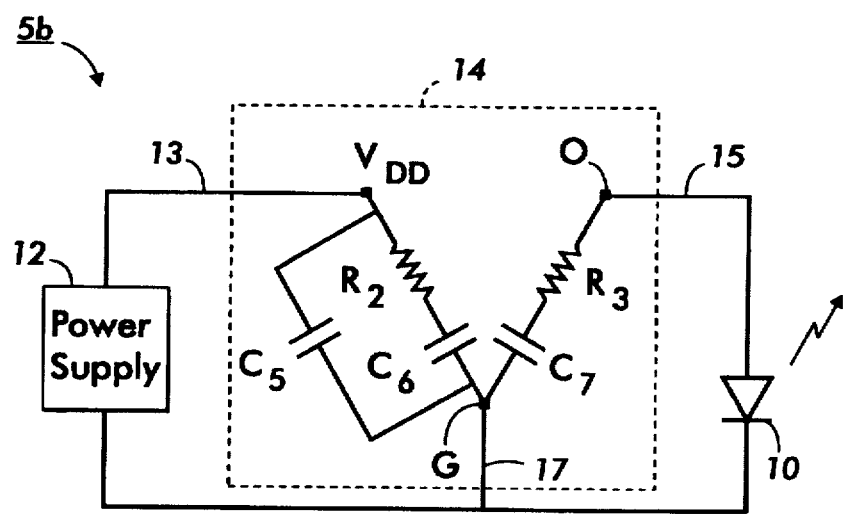
FIG. 10 shows the damping circuit of FIG. 9 being added to the block diagram of FIG. 1.

Once the values of the resistor $R_2$, capacitor $C_6$, resistor $R_3$ and capacitor $C_7$ were defined, they had to be placed on the driver chip 14 of FIG. 1 to determine if they would damp the ringing on the laser diode driving current. Referring to FIG. 10, there is shown $R_2$, $C_6$, $R_3$ and $C_7$ being added to the driver chip 14 of FIG. 1. Resistor $R_2$ and capacitor $C_6$ were placed on the chip between $V_{DD}$ and the chip ground G and resistor $R_3$ and capacitance $C_7$ were placed between the output node O and the chip ground G. Again the reason resistor $R_2$, capacitor $C_6$, resistor $R_3$ and capacitor $C_7$ were placed on the chip was to prevent adding extra lead inductances. Also, since capacitor $C_3$ was an additional capacitance which was placed on the model 35 of FIG. 8, it has to be added to the driver chip between $V_{DD}$ and the chip ground G in parallel to resistor $R_2$ and capacitor $C_6$.

After the resistor $R_1$, the capacitor $C_6$, the resistor $R_3$ and the capacitor $C_7$ were placed on the chip, the ringing on the laser diode driving current was reduced more than the aforementioned approach but again it was not sufficient. Therefore, a different model than the model 35 of FIG. 8 had to be used in order to design a more effective damping circuit.

Figure 11:
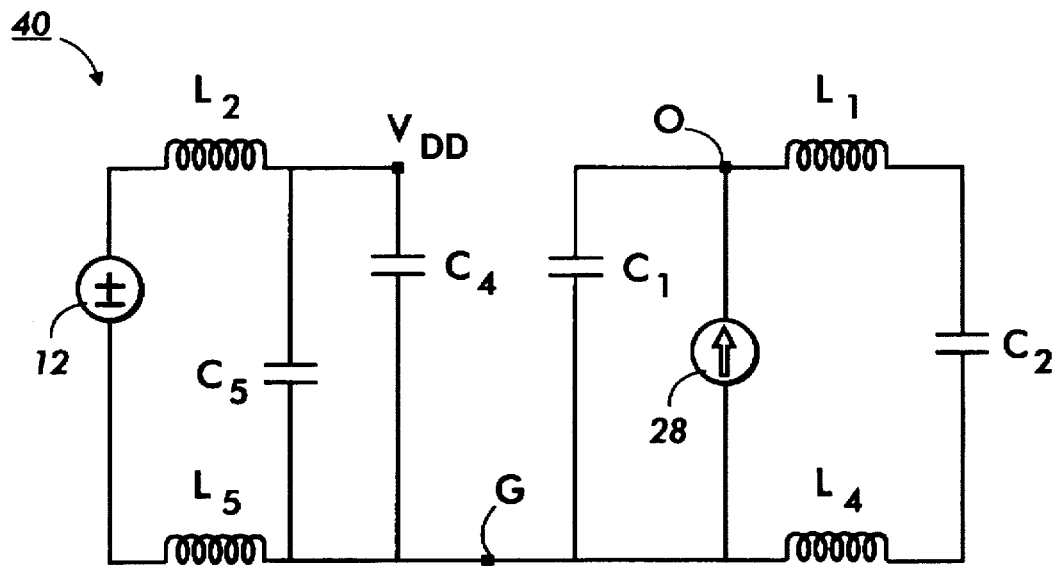
FIG. 11 shows a preferred embodiment of a model for the block diagram of FIG. 1.

Referring to FIG. 11, there is shown yet another model 40 to eliminate the ringing problem of the laser diode driving current. In this approach, the laser diode 10 of FIG. 1 is modeled as capacitance $C_2$. Also, the driver chip 14 of FIG. 1 is modeled as a capacitance $C_1$, current supply 28 and capacitance $C_4$. Capacitance $C_1$ and the current source 28 are considered to be located between the output node O and the chip ground G and capacitor $C_4$ is considered to be located between $V_{DD}$ and the chip ground G. The additional capacitance $C_5$ of FIG. 8 is also included in the model 40 of FIG. 11 between $V_{DD}$ and the chip ground G.

Referring to both FIGS. 1 and 11, it is suggested that the ground lead of the power supply 12 is a separate ground lead than the ground lead of the laser diode 10 as opposed to one common ground lead used in FIG. 8. As a result, the inductance $L_3$ of FIG. 8 is eliminated and two inductances $L_4$ and $L_5$ are placed in model 40 to represent the connection between the laser diode 10 and the driver chip 14 and the connection between the power supply 12 and the laser diode chip 14 respectively.

After separating the ground leads for the laser diode 10 and the power supply 12, eliminating the inductance $L_3$ Of FIG. 8 and placing the solution on the driver chip, it was observed that the oscillations were still coupled. This indicated that there is a parasitic capacitance between the $V_{DD}$ and the output node O of the driver chip 14 of FIG. 1.

Figure 12:
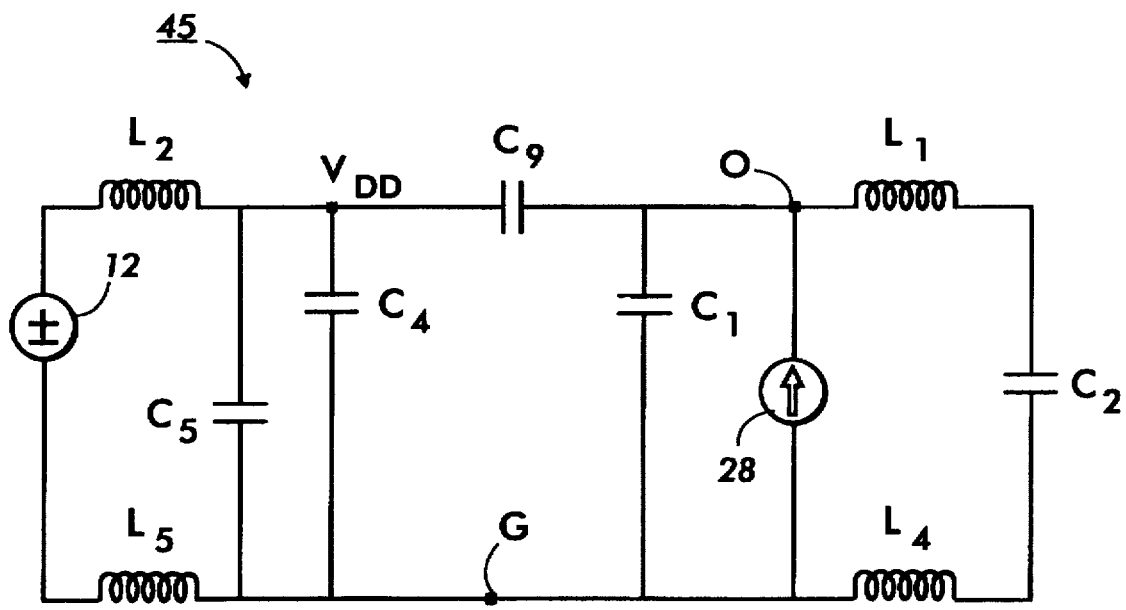
FIG. 12 shows the model of FIG. 11 with the addition of a parasitic capacitance $C_5$ between $V_{DD}$ and the output node O.

Referring to FIG. 12, there is shown model 45 which is model 40 of FIG. 11 with the addition of the parasitic capacitance $C_9$ between $V_{DD}$ and the output node O. In this model 45, the inductances $L_5$ and $L_2$ and the combination of the capacitance $C_4$ and the capacitor $C_5$ generate one resonance mode, inductances $L_1$ and $L_4$ and the capacitance $C_1$ generate a different resonance mode and the combination of the inductances $L_1$ and $L_2$ and the capacitance $C_9$ generate yet a third resonance mode.

Figure 13:
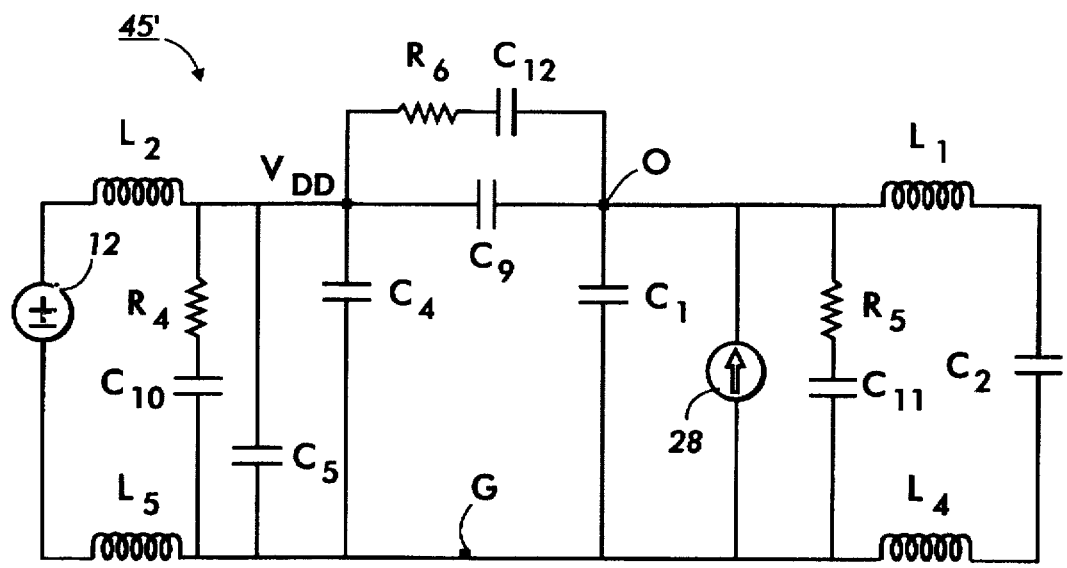
FIG. 13 shows a preferred embodiment of the damping circuit of this invention.

Referring to FIG. 13, there is shown model 45' which is the same as model 45 with the addition of the damping circuit. In FIG. 9, in order to damp each resonance, a separate RC circuit is placed in parallel to each one of the capacitances $C_1$ and $C_4$ and $C_9$ and an RC circuit is placed in parallel to capacitance $C_4$ and capacitor $C_5$. Resistor $R_4$ and the capacitor $C_{10}$ are placed in parallel to capacitance $C_4$ and capacitor $C_5$, resistor $R_5$ and the capacitor $C_{11}$ are placed in parallel to the capacitance $C_1$ and the resistor $R_6$ and the capacitance $C_{12}$ are placed in parallel to the capacitance $C_9$.

Once the values of the resistor $R_4$, capacitor $C_{10}$, resistor $R_5$, capacitor $C_{11}$, resistor $R_6$ and capacitor $C_{12}$ were defined, they were placed on the driver chip 14 of FIG. 1 to determine if they would damp the ringing on the laser diode driving current.

Figure 14:
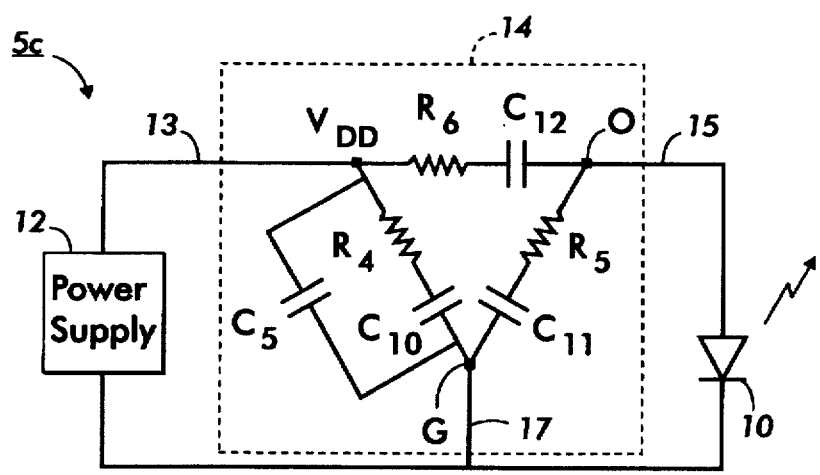
FIG. 14 shows the damping circuit of FIG. 13 being placed on the driver chip of FIG. 1.

Referring to FIG. 14, there is shown $R_4$, $C_{10}$, $R_5$, $C_{11}$, $R_6$ and $C_{12}$ being added to the driver chip 14 of FIG. 1. Resistor $R_4$ and capacitor $C_{10}$ were placed on the chip between $V_{DD}$ and the chip ground G, resistor $R_5$ and capacitance $C_{11}$ were placed between the output node O and the chip ground G and resistor $R_6$ and capacitor $C_{12}$ were placed between $V_{DD}$ and the output node O. Again the reason resistor $R_4$, capacitor $C_{10}$, resistor $R_5$, capacitor $C_{11}$, resistor $R_6$ and capacitor $C_{12}$ were placed on the chip was to prevent adding extra lead inductances. Also, since capacitor $C_5$ was an additional capacitance which was placed on the models 40 and 45 of FIGS. 11 and 12, it has to be added to the driver chip between $V_{DD}$ and the chip ground G in parallel to resistor $R_2$ and capacitor $C_6$.

Figure 3:
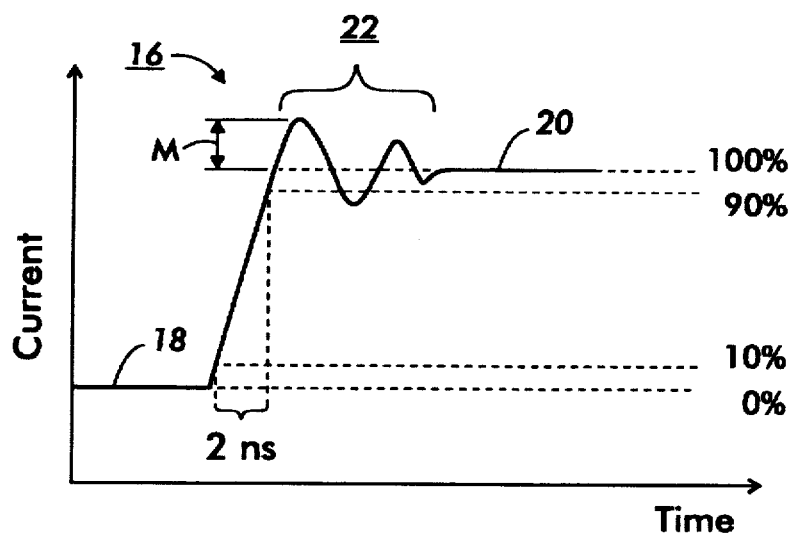
FIG. 3 shows the two level current of FIG. 2 in a real situation.

The circuit shown in FIG. 14, sufficiently reduced the ringing problem of the laser diode driving current 16 of FIG. 3 to under 20% of its first peak while keeping the rise time of the laser diode driving current 16 of FIG. 3 within 2 Ns. Reducing the ringing problem prolongs the lifetime of the laser diode 10 and improves the print quality.

Finding a suitable model for the problem of ringing initially seamed simple. However, initially it was not apparent that there were three different resonances which were coupled. Recognizing the fact that there were coupled resonances was a major step in resolving the ringing problem. Furthermore, recognizing the fact that there were three different resonances which were coupled and finding the sources of the resonances lead to the present invention. As a result, finding a suitable model which initially seemed simple turned out to be complicated evaluation.

The preferred embodiment of the driver chip of this invention utilizes BiCMOS technology. Also, in the preferred embodiment of this invention, the laser diode is a common cathode laser diode which requires a high speed switching. Due to the required high speed switching, the driver chip utilizes large PNP transistors as its output current source.

Since all the added RC circuits of FIG. 13 have to be placed on the driver chip 14 of FIG. 1, the capacitors of the RC circuits have to be optimized for the limited real estate available on the driver chip. The capacitors used in the RC circuits of the preferred embodiment of this invention are bipolar and linear. Typically, in order to eliminate the parasitic capacitances of the bipolar capacitors, each capacitor requires a large gate oxide. Therefore, the sizes of the capacitors are optimized for eliminating the ringing problem and reducing the area used for gate oxide. The total capacitances used in the RC circuits to eliminate the ringing problem are between 250 to 300 PF. This circuit is capable of reducing the ringing of the laser diode driving current with a frequency between 30–300 MHz.

It should be noted that any technology can replace the BiCMOS technology of this invention. However, for each technology, the values of the RC circuits have to be modified.

It should also be noted that the driver chip with the damping circuit of this invention can also be utilizes in conjunction with more complex laser diode packages such as multidiodes on a common substrate tightly packed packages.

It should further be noted that the sizes of the capacitors and the resistors will be selected based on the resonance frequencies of each given system.

We claim:

1. A laser diode driver chip comprising:
   a voltage receiving node;
   an output node;
   a chip ground;
   a first resistor;
   a first capacitor;
   said voltage receiving node and said chip ground being electrically connected to each other through said first resistor and said first capacitor;

said first resistor and said first capacitor between said voltage receiving node and said chip ground being in series with each other;

a second resistor;

a second capacitor;

said output node and said chip ground being electrically connected to each other through said second resistor and said second capacitor;

said second resistor and said second capacitor between said output node and said chip ground being in series with each other; and and said laser diode driver chip, said first resistor, said first capacitor, said second resistor and said second capacitor being so constructed and arranged to substantially reduce ringing on a current generated by said laser diode driver chip.

2. The laser diode driver chip recited in claim 1, wherein said laser diode driver chip has a third capacitor which is electrically connected to said voltage receiving node and to said chip ground and is parallel to said first resistor and said first capacitor.

3. The laser diode driver chip recited in claim 1, wherein said laser diode driver chip has a fourth capacitor which is electrically connected to said voltage receiving node and to said chip ground and is parallel to said first resistor and said first capacitor.

4. A laser diode driver chip comprising:

said laser diode driver chip having a voltage receiving node;

said laser diode driver chip having an output node;

said laser diode driver having a chip ground;

a first resistor;

a first capacitor;

said voltage receiving node and said chip ground being electrically connected to each other through said first resistor and said first capacitor;

said first resistor and said first capacitor between said voltage receiving node and said chip ground being in series with each other;

a second resistor;

a second capacitor;

said output node and said chip ground being electrically connected to each other through said second resistor and said second capacitor;

said second resistor and said second capacitor between said output node and said chip ground being in series with each other;

a third resistor;

a third capacitor;

said voltage receiving node and said output node being electrically connected to each other through said third resistor and said third capacitor;

said third resistor and said third capacitor between said voltage receiving node and said output node being in series with each other; and said laser diode driver chip, said first resistor, said first capacitor, said second resistor, said second capacitor, said third resistor and said third capacitor being so constructed and arranged to substantially reduce ringing on a current generated by said laser diode driver chip.

* * * * *